(12) United States Patent
Park et al.

(10) Patent No.: US 11,244,897 B2
(45) Date of Patent: Feb. 8, 2022

(54) BACK END OF LINE METALLIZATION (71) Applicant: International Business Machines Corporation, Armonk, NY (US)

(72) Inventors: Chanro Park, Clifton Park, NY (US); Koichi Motoyama, Clifton Park, NY (US); Kenneth Chun Kuen Cheng, Albany, NY (US); Somnath Ghosh, Clifton Park, NY (US); Chih-Chao Yang, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 80 days.

(21) Appl. No.: 16/840,506

(22) Filed: Apr. 6, 2020

(65) Prior Publication Data

US 2021/0313264 A1   Oct. 7, 2021

(51) Int. Cl.
| | | |
|---|---|---|
| H01L 23/522 | (2006.01) | |
| H01L 23/532 | (2006.01) | |
| H01L 21/768 | (2006.01) | |
| H01L 23/528 | (2006.01) | |
| H01L 21/033 | (2006.01) | |

(52) U.S. Cl.
CPC .... *H01L 23/5226* (2013.01); *H01L 21/76877* (2013.01); *H01L 23/528* (2013.01); *H01L 23/5329* (2013.01); *H01L 23/53219* (2013.01); *H01L 23/53261* (2013.01); *H01L 21/0332* (2013.01); *H01L 21/76816* (2013.01)

(58) Field of Classification Search
CPC ........... H01L 23/5226; H01L 21/76877; H01L 23/5329; H01L 23/528; H01L 23/53261; H01L 23/53219; H01L 21/76816; H01L 21/0332
See application file for complete search history.

(56) References Cited

U.S. PATENT DOCUMENTS

| | | |
|---|---|---|
| 5,512,514 A | 4/1996 | Lee |
| 5,691,238 A | 11/1997 | Avanzino et al. |
| 5,693,568 A | 12/1997 | Liu et al. |
| 5,773,365 A | 6/1998 | Ito |
| 5,960,254 A | 9/1999 | Cronin |
| 6,352,917 B1 | 3/2002 | Gupta et al. |
| 6,444,565 B1 | 9/2002 | Feild et al. |
| 6,617,239 B1 | 9/2003 | Farrar |
| 8,299,625 B2 | 10/2012 | Ponoth et al. |
| 8,357,609 B2 | 1/2013 | Ryan |
| 8,735,278 B2 | 5/2014 | Lee et al. |
| 9,613,861 B2 | 4/2017 | Anderson et al. |
| 10,177,031 B2 | 1/2019 | Bao et al. |
| 2011/0275214 A1* | 11/2011 | Ryan ................. H01L 21/76897 438/627 |
| 2013/0187273 A1 | 7/2013 | Zhang et al. |

(Continued)

*Primary Examiner* — Patricia D Valenzuela
(74) *Attorney, Agent, or Firm* — Cantor Colburn LLP; L. Jeffrey Kelly (57) ABSTRACT

Interconnect structures and methods for forming the interconnect structures generally include a subtractive etching process to form a fully aligned top via and metal line interconnect structure. The interconnect structure includes a top via and a metal line formed of an alternative metal other than copper or tungsten. A conductive etch stop layer is intermediate the top via and the metal line. The top via is fully aligned to the metal line.

14 Claims, 6 Drawing Sheets

(56) References Cited

U.S. PATENT DOCUMENTS

| | | | |
|---|---|---|---|
| 2015/0056800 A1* | 2/2015 | Mebarki | H01L 21/32139 438/652 |
| 2015/0348832 A1* | 12/2015 | Bruce | H01L 21/76852 257/761 |
| 2020/0161180 A1 | 5/2020 | Mignot et al. | |

* cited by examiner

BACK END OF LINE METALLIZATION

BACKGROUND

The present invention generally relates to semiconductor integrated circuits and methods of fabrication thereof, and more specifically, to interconnect structures and methods to form back end of line metallization interconnect structures.

Integrated circuit processing can be generally divided into front end of the line (FEOL), middle of the line (MOL) and back end of the line (BEOL) processes. The FEOL and MOL processing will generally form many layers of logical and functional devices. By way of example, the typical FEOL processes include wafer preparation, isolation, well formation, gate patterning, spacer, extension and source/drain implantation, silicide formation, and dual stress liner formation. The MOL is mainly gate, and source/drain contacts formation. Layers of interconnections are formed above these logical and functional layers during the BEOL processing to complete the integrated circuit structure. As such, BEOL processing generally involves the formation of insulators and conductive wiring.

SUMMARY

Embodiments of the present invention are generally directed to integrated circuits including interconnect structures formed with alternative metals and methods for fabricating the same. A non-limiting example of an interconnect structure according to aspects of the invention includes a top via including a first alternative conductive metal other than copper or tungsten and a metal line including a second alternative conductive metal. A conductive etch stop layer is intermediate the top via and the metal line. The top via is fully aligned to the metal line.

A non-limiting example method for forming an interconnect structure according to aspects of the invention includes forming a metal stack on a substrate, wherein the metal stack includes an alternative metal other than copper or tungsten. A line pattern is formed from a mandrel on the metal stack. Spacers are formed on sidewalls of the mandrel line pattern, wherein gaps remain between adjacent sidewall spacers. The gaps between the adjacent sidewall spacers are filled with a non-mandrel material to form a non-mandrel line pattern. Via openings are formed in the mandrel line pattern and the non-mandrel line pattern and filled with a fill material. The sidewall spacers are selectively removed to expose portions of the metal stack between the mandrel and non-mandrel line patterns. The exposed portions of the metal stack are selectively etched to a depth corresponding to a desired via height. The mandrel and the non-mandrel line patterns are selectively removed. The metal stack is etched to the substrate to form the interconnect structure including a plurality of metal lines with fully aligned top vias under the fill material. The fill material is then removed.

A non-limiting example subtractive etching method to form a fully aligned top via and metal line interconnect structure according to aspects of the invention includes providing a metal stack on a substrate, the metal stack including a conductive liner layer, a first alternative metal on the conductive liner layer, a conductive etch stop layer on the first alternative metal layer, and a second alternative metal layer on the conductive etch stop layer, wherein the second alternative metal layer has a height equal to a desired top via height and first alternative metal layer has a height equal to a desired metal line height. A mandrel layer is deposited and patterned on the metal stack to form a plurality of mandrel lines. A sidewall spacer is deposited onto the mandrel lines, wherein gaps remain between adjacent sidewall spacers. The gaps are filled with a non-mandrel material to form non-mandrel lines. The mandrel and non-mandrel lines are patterned to form via openings to the second alternative metal layer in the metal stack. The via openings are filled with a fill material having an etch selectivity relative to the mandrel, non-mandrel, metal stack, and sidewall spacers. The sidewall spacers are selectively removed to expose portions of the second alternative metal layer of the metal stack. The exposed portions of the second alternative metal layer are etched to the conductive etch stop layer. The mandrel lines, the non-mandrel lines, and exposed portions of the etch stop layer are selectively removed. Exposed portions of the first alternative metal layer and the liner layer are etched to the substrate; and the fill material is removed to form the fully aligned top via and metal line interconnect structure.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

DETAILED DESCRIPTION

Semiconductor fabrication processes typically use copper or tungsten as the bulk conductive metal for the interconnect structures, most often using a dual damascene process to form a metal line/via interconnect structure. However, as the critical dimensions scale below 30 nm, the copper line resistivity can increase due to electron scattering and other factors. Because of this, replacement of conventional metals such as copper and tungsten in interconnects is necessitated. At interconnect linewidths of less than 15 nanometers (nm), resistivity of copper, for example, increases due to grain boundary and surface scattering not to mention making it more difficult to prevent electromigration. Barrier layers for copper at these scaled dimensions are likely to be on the order of about 1 nm or less. These issues can be addressed by replacing the conventional metal with an alternative metal to provide increased reliability and lower line resistance.

In embodiments of the present invention, a top via integration scheme is presented that utilizes subtractive etching to form lines and vias. However, fabrication of tall metal interconnect structures, whose thickness includes the combined thickness of the line and top via, presents challenges. Subtractive etching the tall metal interconnect structures, which can be greater than 70 nm in height, can be difficult at pitches less 26 nm without causing shorts or opens. Embodiments of the present invention overcome the above noted problems and provides a subtractive etching method for fabricating interconnect structures including tall metal interconnect structure thicknesses with alternative metals such as ruthenium, which can be used at pitches less than 26 nm. As will be described in greater detail, the subtractive line and top via integration scheme in accordance with one or more aspects of the present invention can provide predetermined metal line and via heights with the top vias fully aligned to the metal line. As will be described in greater detail below, via openings corresponding to the top vias are first filled with a sacrificial material that acts as a hardmask during metal etching in the subtractive process.

Detailed embodiments of the integrated circuit including an interconnect structure and methods for fabricating the integrated circuit including the interconnect structure according to aspects of the present invention will now be described herein. However, it is to be understood that the embodiments of the invention described herein are merely illustrative of the structures that can be embodied in various forms. In addition, each of the examples given in connection with the various embodiments of the invention is intended to be illustrative, and not restrictive. Further, the figures are not necessarily to scale, some features can be exaggerated to show details of particular components. Therefore, specific structural and functional details described herein are not to be interpreted as limiting, but merely as a representative basis for teaching one skilled in the art to variously employ the methods and structures of the present description. For the purposes of the description hereinafter, the terms "upper", "lower", "top", "bottom", "left," and "right," and derivatives thereof shall relate to the described structures, as they are oriented in the drawing figures. The same numbers in the various figures can refer to the same structural component or part thereof.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

Conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

It is to be understood that the various layers and/or regions shown in the accompanying drawings are not drawn to scale, and that one or more layers and/or regions of a type commonly used in complementary metal-oxide semiconductor (CMOS), fin field-effect transistor (FinFET), metal-oxide-semiconductor field-effect transistor (MOSFET), and/or other semiconductor devices, may or may not be explicitly shown in a given drawing. This does not imply that the layers and/or regions not explicitly shown are omitted from the actual devices. In addition, certain elements could be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention can include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that could require, for example, CMOSs, MOSFETs, and/or FinFETs. By way of non-limiting example, the semiconductor devices can include, but are not limited to CMOS, MOSFET, and FinFET devices, and/or semiconductor devices that use CMOS, MOSFET, and/or FinFET technology.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements can also be present. In contrast, when an element is referred to as being "directly on" or "directly over" another element, there are no intervening elements present, and the element is in contact with another element.

As used herein, the term "substrate" can include a semiconductor wafer, such as a type IV semiconductor wafer, e.g., silicon wafer, or a type III-V semiconductor wafer, such as a compound semiconductor, e.g., gallium arsenide semiconductor wafer. In one or more embodiments, a number of dielectric layers and semiconductor material layers can be arranged with the substrate to provide microelectronic devices, or smaller devices, which can include semiconductor devices, such as field effect transistors (FETs), fin type field effect transistors (FinFETs), bipolar junction transistors (BJT) and combinations thereof. The at least one device layer can also include memory devices, such as dynamic random access memory (DRAM), embedded dynamic random access memory (EDRAM), flash memory and combinations thereof. The at least one device layer can also include passive devices, such as resistors and capacitors, as well as electrical connections to the devices containing within the at least one device layer.

When patterning any material herein, the material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned (which portion of the resist that is rinsed off depends upon whether the resist is a negative resist (illuminated portions remain) or positive resist (illuminated portions are rinsed off). A material removal process is then performed (e.g., plasma etching, etc.) to remove the unprotected portions of the material below the resist to be patterned. The resist is subsequently removed to leave the underlying material patterned according to the light exposure pattern (or a negative image thereof).

Figure 1:
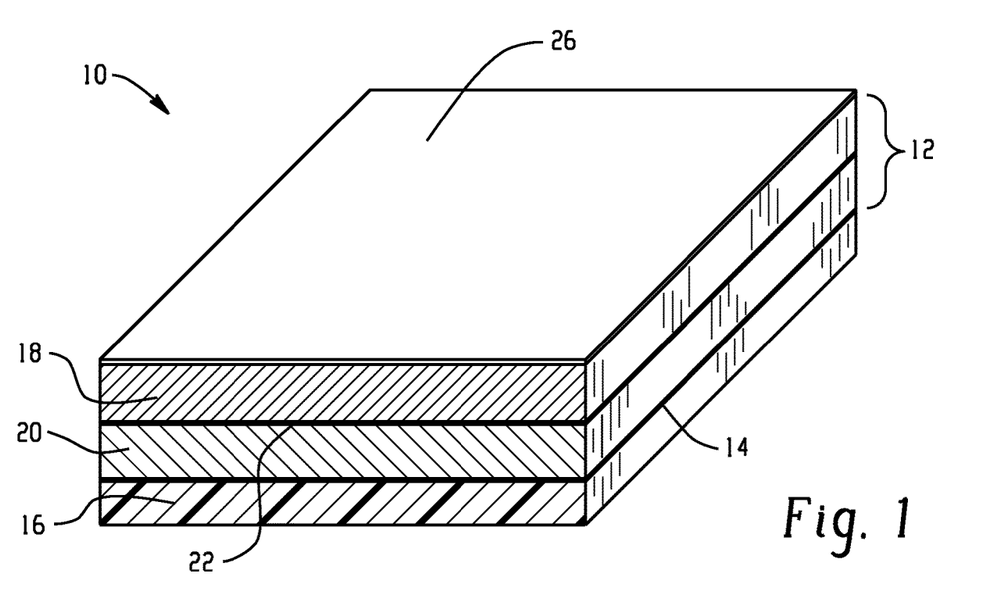
FIG. 1 depicts a perspective view of an integrated circuit including a metal stack on an interlayer dielectric in accordance with one or more embodiments of the present invention.

Turning now to FIG. 1, a perspective view of a partial integrated circuit 10 for forming a top via and metal line interconnect structure is depicted. The partial integrated circuit 10 includes a metal stack 12 on a liner layer 14, which are deposited onto an interlayer dielectric or substrate 16 in accordance with one or more embodiments of the present invention. In one or more embodiments of the invention, the metal stack 12 can include a single layer (not shown) of an alternative metal having a thickness corresponding to an overall height of the intended metal line and top via interconnect structure, i.e., a thickness equal to the tall metal. In one or more embodiments, the metal stack 12 can include two layers 18, 20 of the alternative metal having a combined thickness corresponding to an overall height of the intended metal line and top via interconnect structure, wherein alternative metal layer 18 has a thickness corresponding to the top via height and alternative metal layer 20 has a thickness corresponding the metal line height. The alternative metals in each layer can be the same or different. An optional metal etch stop layer 22 can be provided intermediate alternative metal layer 18 and alternative metal layer 20. In the single layer and dual layer metal stack embodiments discussed above, an optional metallic hardmask 26 can be provided on a top surface of the metal stack 12.

The liner layer 14 can include tantalum, tantalum nitride, cobalt, ruthenium, titanium, titanium nitride, tungsten nitride, or combinations of more than one material (for example tantalum nitride/tantalum or tantalum nitride/cobalt). The presence of the liner layer such as titanium nitride, for example, ensures that the alternative metal, which can participate in interdiffusion during subsequent annealing processes, will not further diffuse into interlayer dielectric 16. Additionally, the liner layer can serve as an etch stop layer as well as provide increased adhesion of the alternative metal to the liner layer. The liner layer can be deposited by PVD, CVD, or ALD processes.

The interlayer dielectric 16 can be any dielectric material including inorganic dielectrics or organic dielectrics. The dielectric material can be porous or non-porous. Some examples of suitable dielectrics that can be used as the dielectric material include, but are not limited to: $SiO_2$, silsesquioxanes, carbon doped oxides (i.e., organosilicates) that include atoms of Si, C, O and H, thermosetting polyarylene ethers, or multilayers thereof. The term "polyarylene" is used to denote aryl moieties or inertly substituted aryl moieties which are linked together by bonds, fused rings, or inert linking groups such as, for example, oxygen, sulfur, sulfone, sulfoxide, carbonyl and the like. The interlayer dielectric 16 can be deposited by PECVD procedures as is generally known in the art. Typically, the dielectric layer is silicon dioxide.

The interlayer dielectric layer or substrate 16 can include front end of line devices, middle of the line contact or plug structures, or back end of line interconnect structures.

The alternative metal layers 18 and 20 include conductive metals other than copper and tungsten. Suitable alternative metals include ruthenium, iridium, rhodium, molybdenum, cobalt, aluminum, osmium, combinations thereof, and alloys thereof. These metals are generally stable when in contact with dielectrics such as silicon dioxide and could provide barrierless metallization. The alternative metal layers 18, 20 can be formed by CVD, sputtering, electrochemical deposition or like processes.

Figure 2:
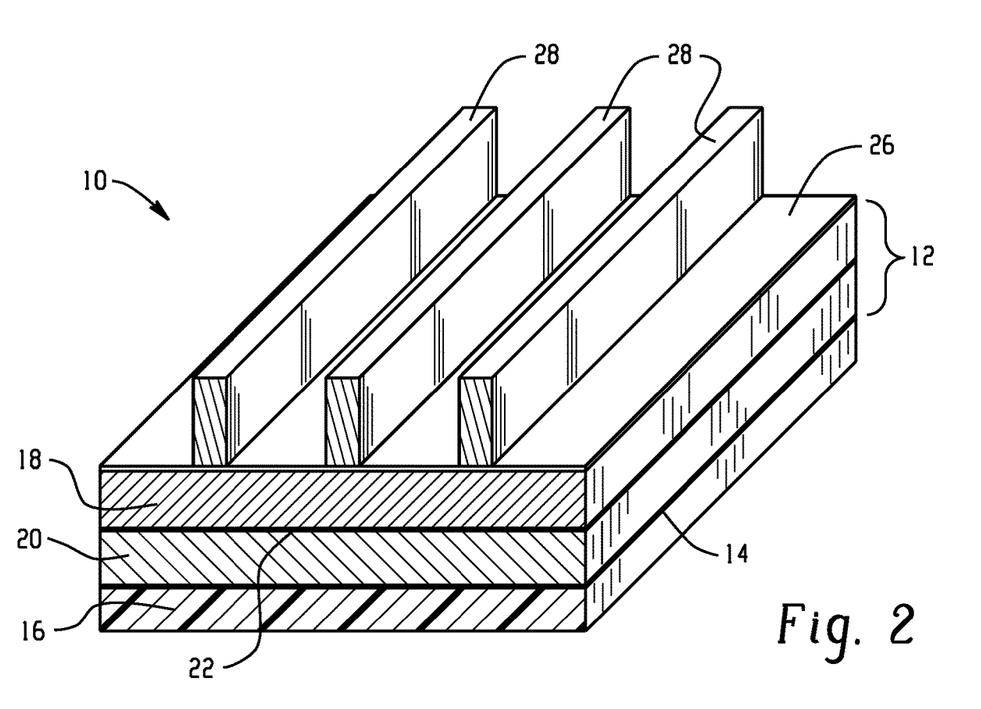
FIG. 2 depicts a perspective view of the integrated circuit of FIG. 1 subsequent to deposition and patterning of a mandrel to form a plurality of lines on the metal stack in accordance with one or more embodiments of the present invention.

The optional metal etch stop layer 22 and the optional metallic hardmask layer 26 can be formed from nitrides of titanium, cobalt, tantalum, rhodium, tungsten, combinations thereof, alloys thereof or the like. The metal etch stop layer 22 and the metal hardmask layer 26 can be the same metal or different metals. The metal etch stop layer 22 and the metal hardmask layer 26 can be formed by CVD, sputtering, electrochemical deposition or like processes FIG. 2 depicts a perspective view of the integrated circuit of FIG. 1 subsequent to deposition and patterning of a mandrel layer to form a plurality of mandrel lines 28 on the metal stack 12 in accordance with one or more embodiments of the present invention. The mandrel layer can be formed by CVD, PECVD, PVD, a spin-on process, or combinations thereof, where the mandrel layer can be blanket deposited on the metal stack 12 or the optional hardmask layer 36. In one or more embodiments, the mandrel layer is a sacrificial material that can be easily and selectively patterned and etched as well as provide good profile control. The mandrel layer can be amorphous silicon (a-Si), poly-silicon (p-Si), amorphous carbon (a-C), silicon-germanium (SiGe), an organic planarization layer (OPL), silicon oxide (SiO), silicon nitride (SiN), or suitable combinations thereof. In one or more embodiments, the mandrel lines 28 formed in mandrel layer on the metal stack 12 have a linewidth of less than 15 nm.

Figure 3:
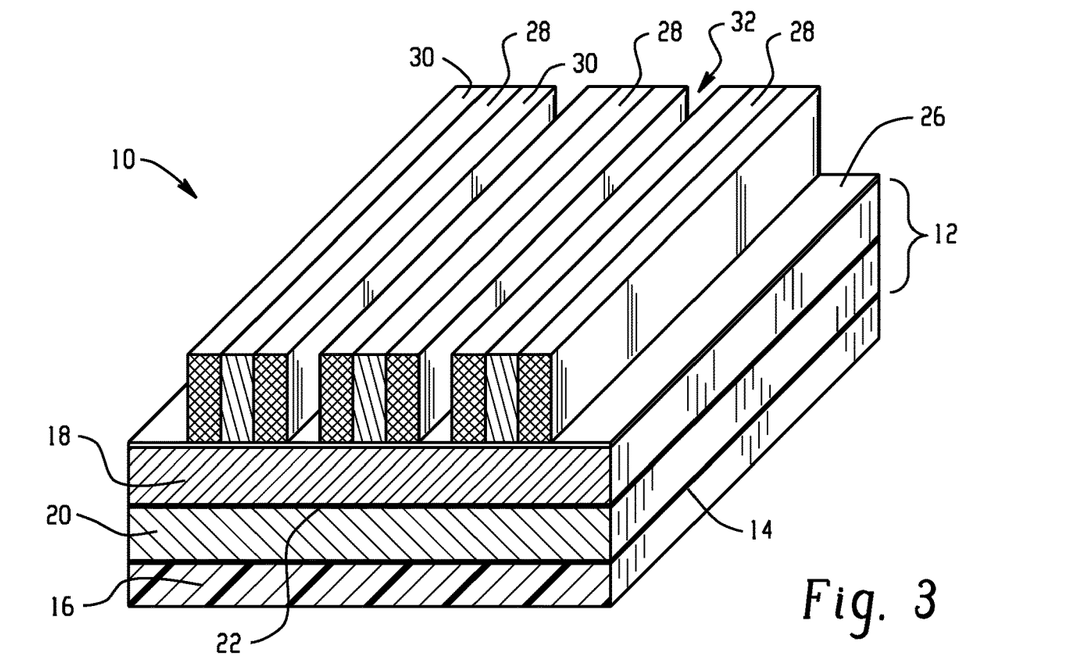
FIG. 3 depicts a perspective view of the integrated circuit of FIG. 2 subsequent to spacer formation on sidewalls of the mandrel lines in accordance with one or more embodiments of the present invention.

FIG. 3 depicts a perspective view of the integrated circuit of FIG. 2 subsequent to spacer formation on sidewalls of the mandrel lines 28 to form sidewall spacers 30 in accordance with one or more embodiments of the present invention. The sidewall spacers 30 can be formed by a conformal deposition process, for example, atomic layer deposition or plasma enhanced atomic layer deposition, to control the thickness of the sidewall spacer layer followed by directional etch and planarization to form the spacer material on the sidewalls of the mandrel lines. In one or more embodiments, the thickness of the sidewall spacer 30 can be the same as the linewidth thickness of the mandrel. In one or more embodiments, the thickness of the sidewall spacer 30 is less than 15 nm. Suitable materials for defining the sidewall spacer are not intended to be limited and is generally chosen based on etch selectivity to the mandrel lines (and non-mandrel lines as will be discussed in greater detail below) and the optional metallic hardmask layer 26, if present. In one or more embodiments, the sidewall spacer layer 30 can be silicon oxide (SiO), silicon nitride (SiN), silicon oxynitride (SiON), silicon carbide (SiC), conformal amorphous carbon (a-C), or combinations thereof. A gap 32 is formed between adjacent sidewall spacers 30, wherein the gap 32 has a width about equal to the sidewall spacer 30 and/or mandrel lines 28.

Figure 4:
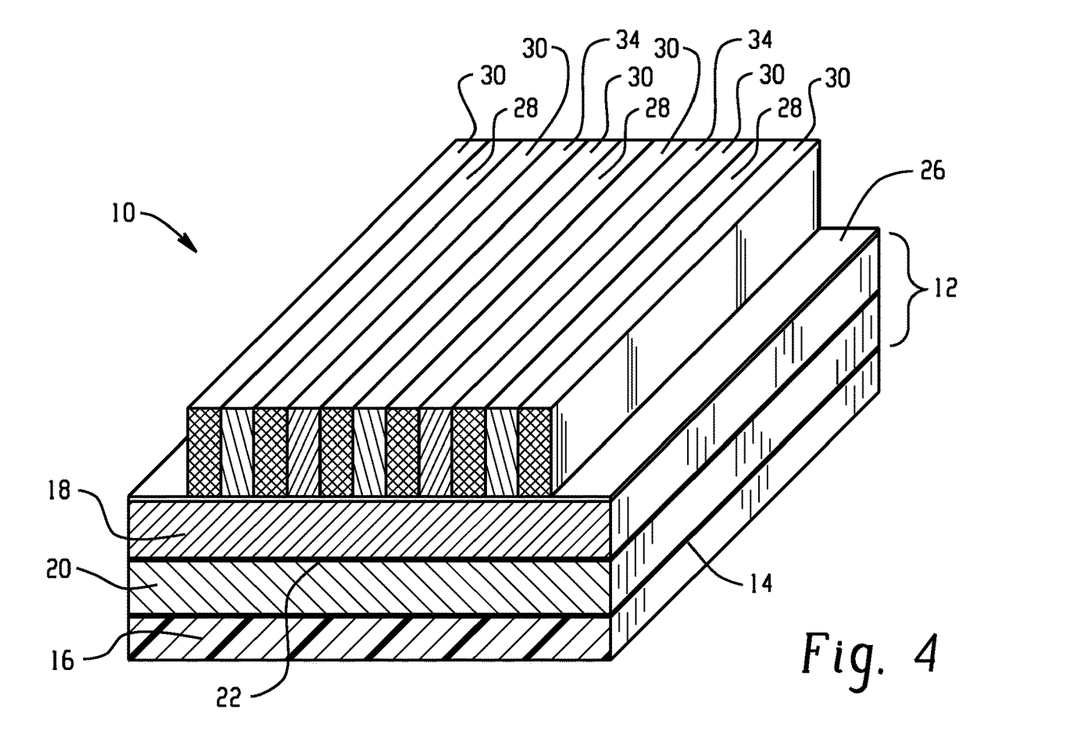
FIG. 4 depicts a perspective view of the integrated circuit of FIG. 3 subsequent to deposition of a non-mandrel in gaps formed between the mandrel lines and sidewall spacers in accordance with one or more embodiments of the present invention.

FIG. 4 depicts a perspective view of the integrated circuit of FIG. 3 subsequent to deposition of a non-mandrel lines 34 in the gaps 32 (as shown in FIG. 3) formed between adjacent sidewall spacers 30 in accordance with one or more embodiments of the present invention. The material defining the non-mandrel lines is selected to provide good gap fill capability and etch selectively to the mandrel lines 28, sidewall spacers 30, and the optional metallic hardmask layer 26. Suitable non-mandrel materials include, without limitation, spin-on-glass, silicon, silicon-germanium, silicon dioxide, silicon nitride, silicon carbide, amorphous carbon, or combinations thereof. A planarization process is utilized subsequent to deposition of the non-mandrel material 34 into the gaps 32. By way of example, the surface can be planarized using a chemical mechanical polishing (CMP) process. The CMP process planarizes the surface by a combination of chemical and mechanical forces using a non-selective slurry composition generally known in the art. The slurry composition contains a silica abrasive material, which removes the different materials layers at substantially the same rate. Alternatively, a planar surface can be formed by a non-selective plasma etching process.

Figure 5:
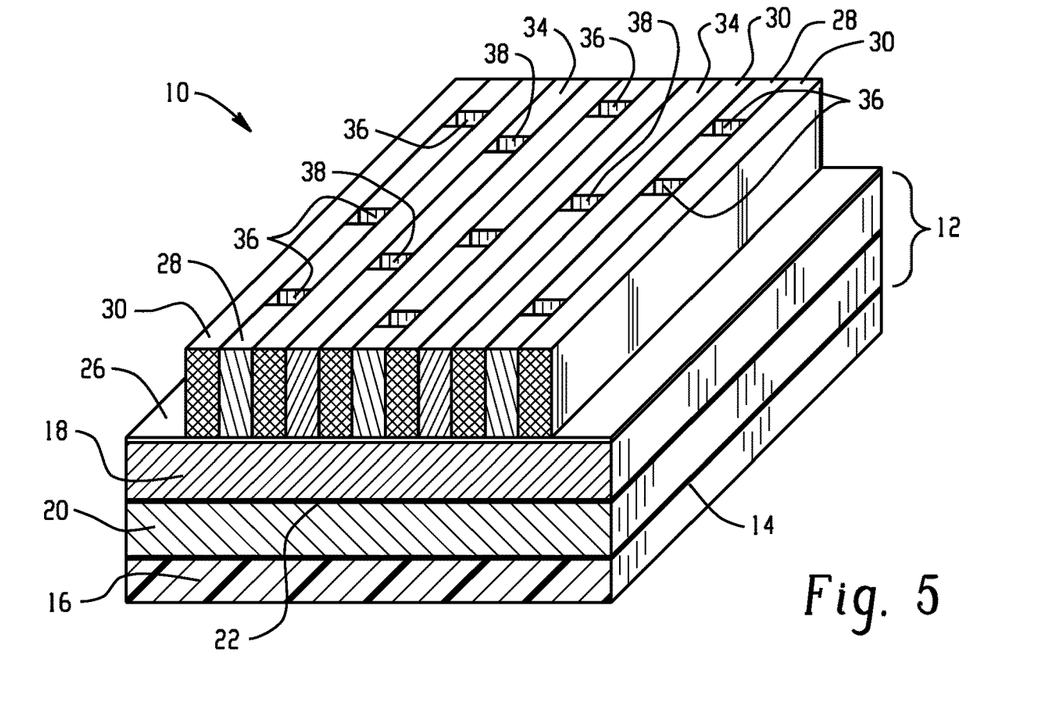
FIG. 5 depicts a perspective view of the integrated circuit of FIG. 4 subsequent to via patterning through the mandrel and non-mandrel lines stopping on the metal stack in accordance with one or more embodiments of the present invention.

FIG. 5 depicts a perspective view of the integrated circuit of FIG. 4 subsequent to via patterning of via openings 36 in the mandrel lines 28 and via openings 38 in the non-mandrel lines stopping on the metal stack 12 (or optional metallic hardmask layer 26, if present) in accordance with one or more embodiments of the present invention. The via openings 36, 38 can be formed using lithography to form openings in a photoresist (not shown) corresponding to the via openings 36, 38 followed by pattern transfer using a directional etch process such as reactive ion etch.

Figure 6:
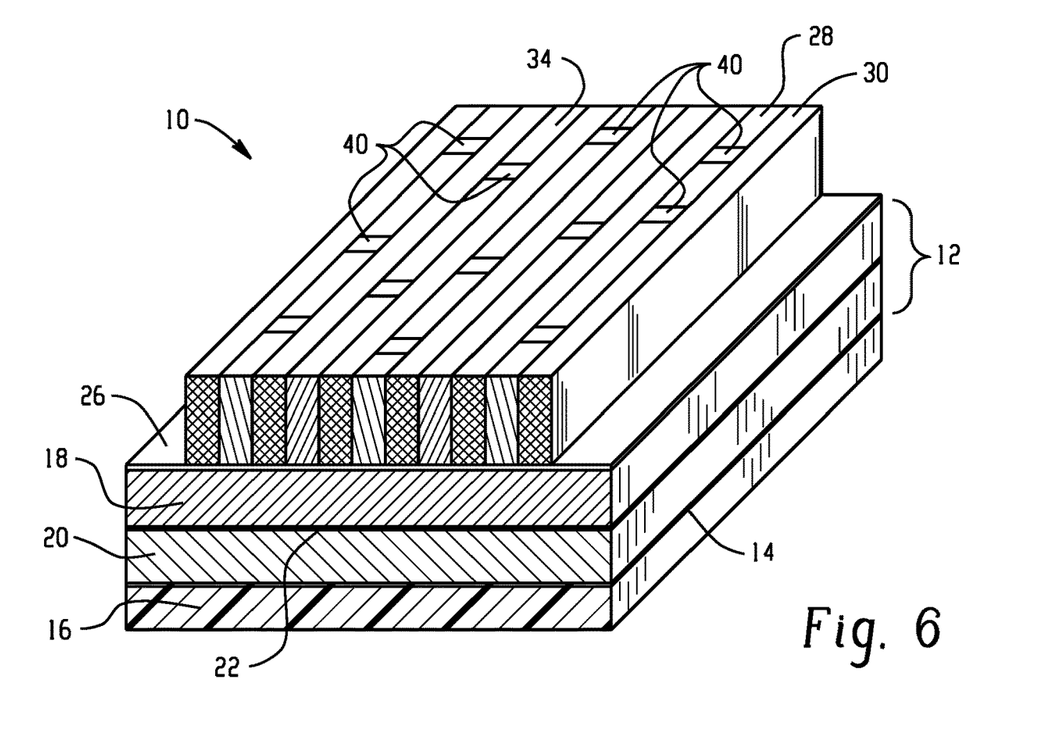
FIG. 6 depicts a perspective view of the integrated circuit of FIG. 5 subsequent to via fill and planarization in accordance with one or more embodiments of the present invention.

FIG. 6 depicts a perspective view of the integrated circuit of FIG. 5 subsequent to deposition of a fill material in the via openings 36, 38 to form filled vias 40 followed by planarization in accordance with one or more embodiments of the present invention. As will be apparent from the detailed description below, the surface does not have to be flat. The vias are filled with a material having good fill capability and etch selectivity to the alternative metal in the metal stack 12, mandrel lines 28, non-mandrel lines 34 and optional metallic hardmask 26. Exemplary via fill materials include, without limitation, silicon dioxide, silicon nitride, silicon carbonitride, silicon oxynitride, titanium nitride, titanium oxide, tantalum nitride, or the like.

Figure 7:
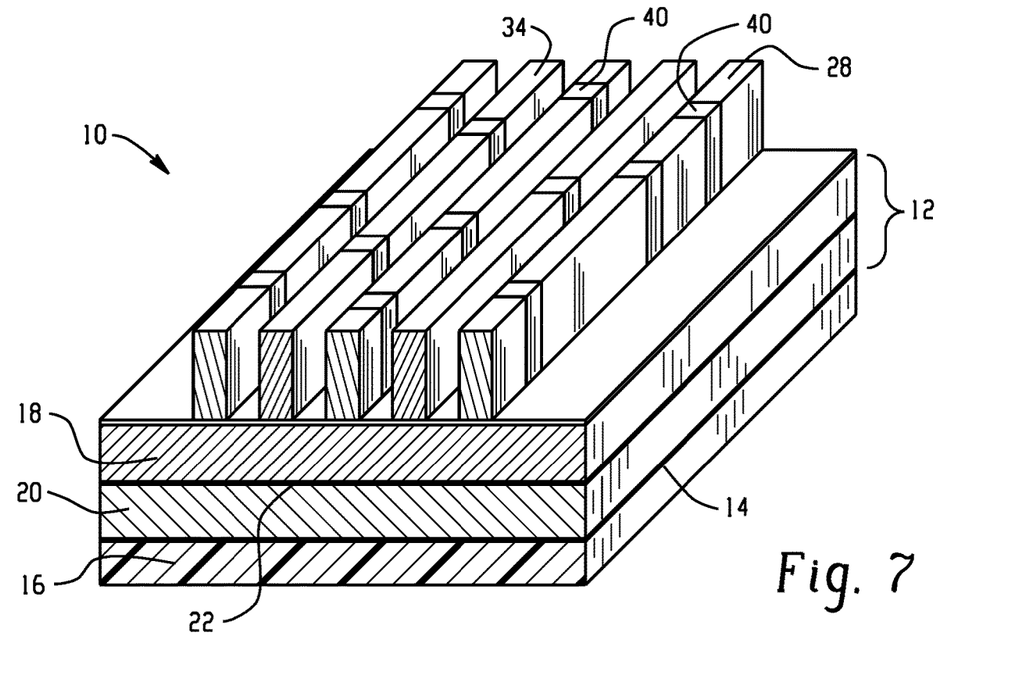
FIG. 7 depicts a perspective view of the integrated circuit of FIG. 6 subsequent to spacer removal in accordance with one or more embodiments of the present invention.

FIG. 7 depicts a perspective view of the integrated circuit of FIG. 6 subsequent to selective removal of the sidewall spacers 30 relative to the mandrel lines 28, non-mandrel lines 34, filled vias 40, and the optional metallic hardmask 26 in accordance with one or more embodiments of the present invention. Selective removal of the sidewall spacers 30 can be a dry etch process or a wet etch process as is generally known in the art. Subsequent to selective spacer removal, exposed portions of the optional metallic hardmask 26 can be opened, i.e., selectively etched.

Figure 8:
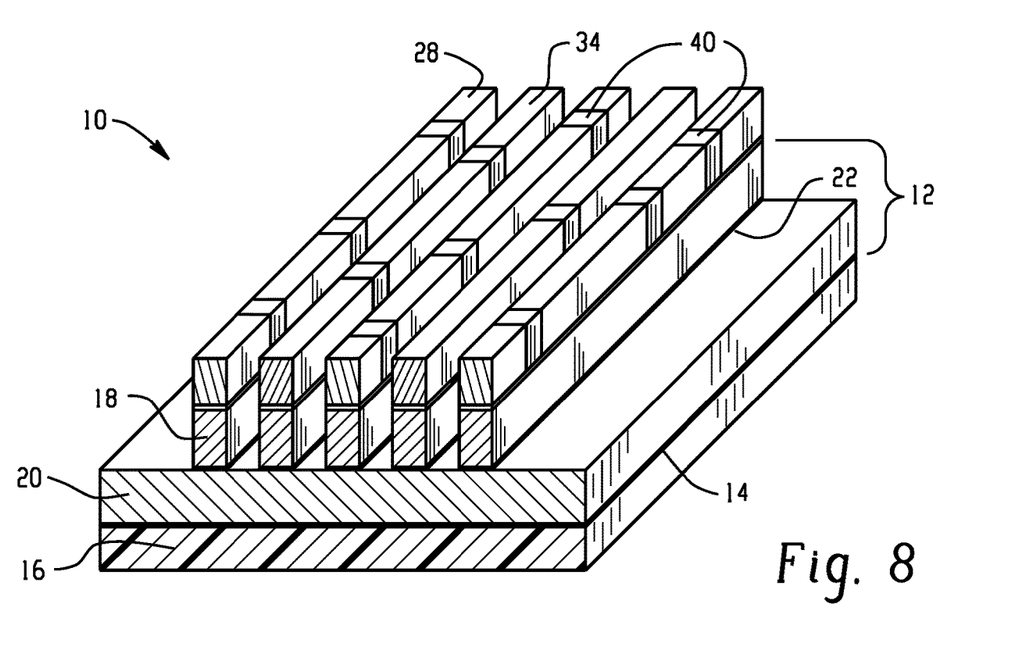
FIG. 8 depicts a perspective view of the integrated circuit of FIG. 7 subsequent to partial etch into the metal stack corresponding to a top via height or less in accordance with one or more embodiments of the present invention.

FIG. 8 depicts a perspective view of the integrated circuit of FIG. 7 subsequent to partial etch of the metal stack 12 in an amount corresponding to a top via height or less depending on the etching target in accordance with one or more embodiments of the present invention. In one or more embodiments, the metal stack 12 is a single layer of the alternative metal and etching process is a timed etch. In one or more embodiments, the metal stack 12 includes an etch stop layer 22 and alternative metal layer 18, wherein the partial etch is to the etch stop layer 22. As previously discussed, alternative layer 18 has a thickness corresponding to the intended via height in the top via interconnect structure.

Figure 9:
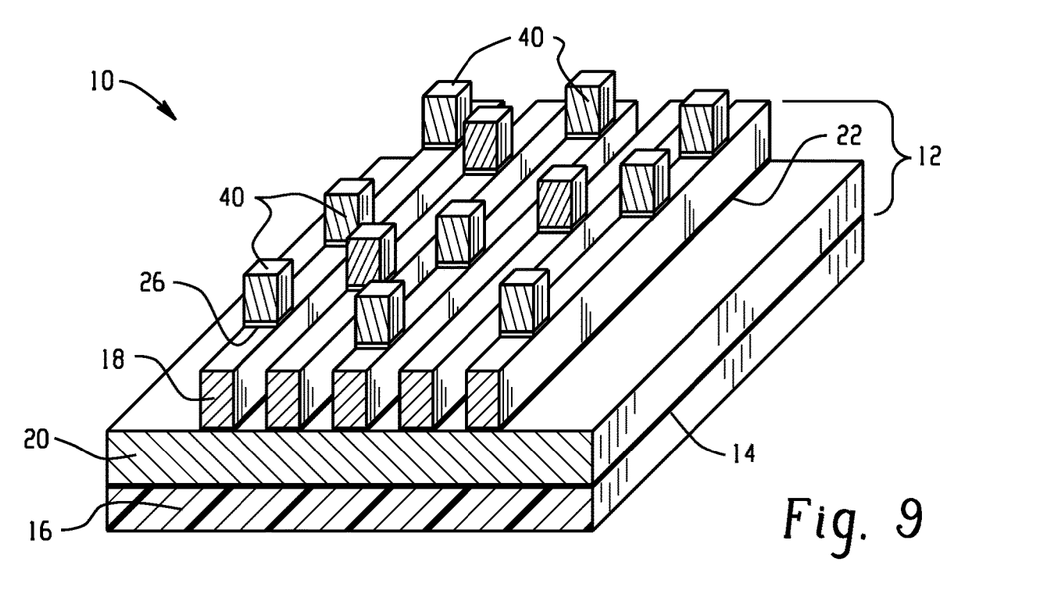
FIG. 9 depicts a perspective view of the integrated circuit of FIG. 8 subsequent to selective removal of the mandrel and non-mandrel in accordance with one or more embodiments of the present invention.

FIG. 9 depicts a perspective view of the integrated circuit of FIG. 8 subsequent to selective removal of the mandrel lines 28 and non-mandrel lines 34 in accordance with one or more embodiments of the present invention. Selective removal can be a wet or dry etch process to anisotropically remove the mandrel lines 28 and non-mandrel lines 34. Removal can be a single step removal process configured to remove both the mandrel lines 28 and non-mandrel lines 34 or a two-step removal process to sequentially remove the mandrel lines 28 and non-mandrel lines 34. Additionally, exposed portions of the etch stop layer 22, if present, can be anisotropically removed.

Figure 10:
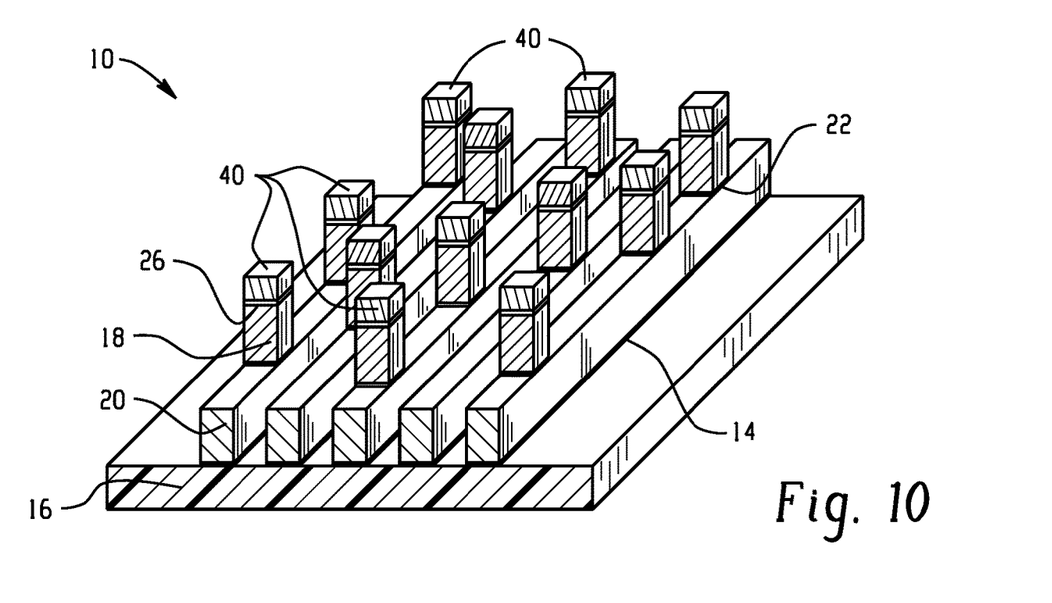
FIG. 10 depicts a perspective view of the integrated circuit of FIG. 9 subsequent to directional etch to the interlayer dielectric in accordance with one or more embodiments of the present invention.

FIG. 10 depicts a cross section of the integrated circuit of FIG. 9 subsequent to directional etch of the metal stack 12 to the interlayer dielectric 16 in accordance with one or more embodiments of the present invention. Directional etch results in a metal via formed directly under the via fill material. Moreover, directional etch provides a constant effective aspect ratio since the upper portion of the alternative metal is etched at the same rate as the lower portion of the alternative metal in the metal stack 12. In embodiments where the metal stack 12 includes an etch stop layer 22 between alternative metal layers 16 and 18, the via and line heights are well controlled.

Figure 11:
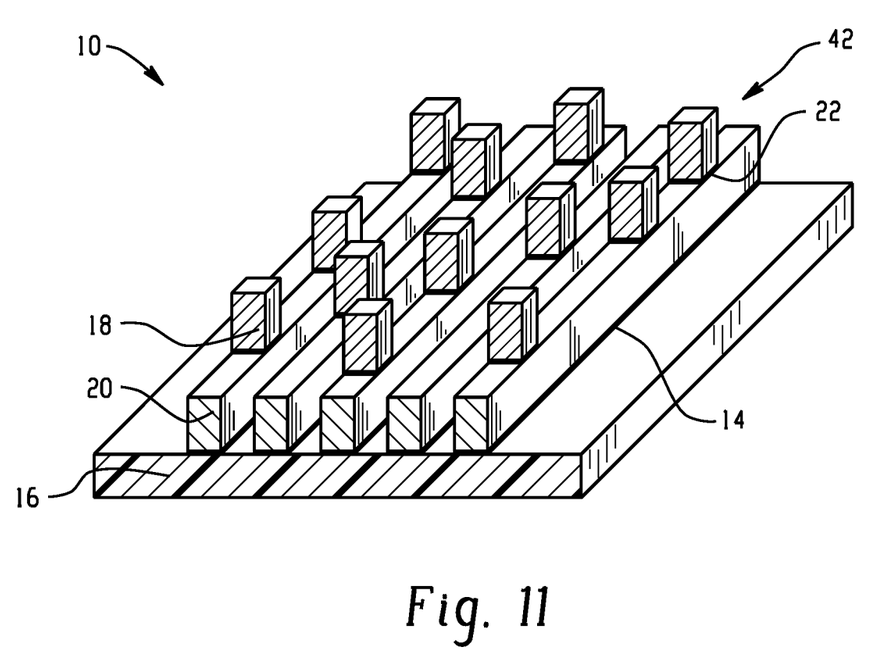
FIG. 11 depicts a perspective view of the integrated circuit of FIG. 10 subsequent to via fil removal in accordance with one or more embodiments of the present invention.

FIG. 11 depicts a perspective view of the integrated circuit of FIG. 10 subsequent to via fill removal using a dry etch or wet etch process in accordance with one or more embodiments of the present invention. Removal of the via fill provides the integrated circuit with a top via-line interconnect structure 42. A low k dielectric (not shown) i.e., an insulating material having a dielectric constant of less than 3.9 can then be deposited to complete the metallization level including the top via-metal line interconnect structure. The low k dielectric is not intended to be limited and can include carbon doped oxides, porous materials such as porous silicon dioxide or porous carbon-doped oxides, spin-on polymer dielectric, spin-on silicon based polymeric dielectrics such as silsesquioxanes, air gaps, fluorine doped silicon dioxide and the like. The alternative metal in the metal lines and in the top vias can be the same or different.

The descriptions of the various embodiments of the present invention have been presented for purposes of illustration but are not intended to be exhaustive or limited to the embodiments of the invention described. Many modifications and variations will be apparent to those of ordinary skill in the art without departing from the scope and spirit of the described embodiments of the invention. The terminology used herein was chosen to best explain the principles of the embodiments of the invention, the practical application or technical improvement over technologies found in the marketplace, or to enable others of ordinary skill in the art to understand the embodiments of the invention described herein.

What is claimed is:

1. A method of forming an interconnect structure, the method comprising:
    forming a metal stack on a substrate, wherein the metal stack comprises an alternative metal other than copper or tungsten;
    forming a line pattern from a mandrel deposited on the metal stack, the mandrel comprising a height dimension greater than a width dimension;
    forming a spacer on sidewalls of the mandrel line pattern, wherein gaps remain between adjacent sidewall spacers;
    filling the gaps between the adjacent sidewall spacers with a non-mandrel material to form a non-mandrel line pattern;
    forming via openings in the mandrel line pattern and the non-mandrel line pattern;
    filling the via openings with a fill material;
    selectively removing the sidewall spacers to expose portions of the metal stack between the mandrel line pattern and the non-mandrel line pattern;
    selectively etching the exposed portions of the metal stack to a depth corresponding to a desired via height;
    selectively removing the mandrel and the non-mandrel line patterns;
    etching the metal stack to the substrate to form the interconnect structure comprising a plurality of metal lines with fully aligned top vias formed of the alternative metal under the fill material; and
    removing the fill material.

2. The method of claim 1, wherein the substrate comprises an interlayer dielectric including an underlying interconnect structure, or one or more front end of line devices, or a middle of the line contact structure, wherein the metal lines are electrically coupled thereto.

3. The method of claim 1, wherein the alternative metal comprises ruthenium, iridium, rhodium, molybdenum, cobalt, aluminum, combinations thereof, or alloys thereof.

4. The method of claim 1, wherein the metal stack comprises a conductive etch stop layer between a first metal layer and a second metal layer, wherein the second metal layer is on the first metal layer, wherein the second metal layer corresponds to the via height and the first metal layer corresponds to a metal line height.

5. The method of claim 4, wherein the conductive etch stop layer comprises titanium, cobalt, tantalum, rhodium, tungsten, combinations thereof, or alloys thereof.

6. The method of claim 4 further comprising anisotropically etching to selectively remove the etch stop layer subsequent to selectively etching the exposed portions of the metal stack.

7. The method of claim 1, wherein the mandrel and the non-mandrel line patterns are etch selective relative to the fill material, the sidewall spacers, and the metal stack.

8. The method of claim 1 further comprising depositing a hardmask on the mandrel prior to forming the mandrel line pattern; and patterning the hardmask to lithographically form the mandrel line pattern.

9. The method of claim 1, wherein selectively etching the exposed portions of the metal stack to the depth corresponding to the desired via height comprises a time-based etching process.

10. The method of claim 1 further comprising depositing a conductive liner layer on the substrate prior to forming the metal stack.

11. A subtractive etching method to form a fully aligned top via and metal line interconnect structure, the method comprising:
    providing a metal stack on a substrate, the metal stack comprising a conductive liner layer, a first alternative metal on the conductive liner layer, a conductive etch stop layer on the first alternative metal layer, and a second alternative metal layer on the conductive etch stop layer, wherein the second alternative metal layer has a height equal to a desired top via height and first alternative metal layer has a height equal to a desired metal line height;

depositing and patterning a mandrel layer on the metal stack to form a plurality of mandrel lines, the mandrel comprising a height dimension greater than a width dimension;

depositing a sidewall spacer onto the mandrel lines, wherein gaps remain between adjacent sidewall spacers;

filling the gaps between the adjacent sidewall spacers with a non-mandrel material to form non-mandrel lines;

patterning the mandrel lines and non-mandrel lines to form via openings to the second alternative metal layer in the metal stack;

filling the via openings with a fill material having etch selectivity relative to the mandrel lines, non-mandrel lines, metal stack, and sidewall spacers;

selectively removing the sidewall spacers to expose portions of the second alternative metal layer of the metal stack;

etching the exposed portions of the second alternative metal layer to the conductive etch stop layer;

selectively removing the mandrel lines, the non-mandrel lines, and exposed portions of the etch stop layer;

etching exposed portions of the first alternative metal layer and the liner layer to the substrate;

selectively removing the fill material to form the interconnect structure comprising the fully aligned top via of the second alternative metal and the metal line of the first alternative metal.

12. The method of claim 11, wherein the first and second alternative metal layers are free from copper and tungsten and comprise ruthenium, iridium, rhodium, molybdenum, cobalt, aluminum, combinations thereof, or alloys thereof.

13. The method of claim 11, wherein the conductive etch stop layer comprises titanium, cobalt, tantalum, rhodium, tungsten, combinations thereof, or alloys thereof.

14. The method of claim 11, wherein the substrate comprises an interlayer dielectric including an underlying interconnect structure, or one or more devices, or a middle of the line contact or plug structure, wherein the metal lines are electrically coupled thereto.

* * * * *